United States Patent
Song et al.

(10) Patent No.: US 11,784,112 B2
(45) Date of Patent: Oct. 10, 2023

(54) INTEGRATED CIRCUIT PACKAGE AND METHOD TO MANUFACTURE THE INTEGRATED CIRCUIT PACKAGE TO REDUCE BOND WIRE DEFECTS IN THE INTEGRATED CIRCUIT PACKAGE

(71) Applicant: NXP USA, Inc., Austin, TX (US)

(72) Inventors: Jian Song, Tianjin (CN); Jun Li, Tianjin (CN); Xingshou Pang, Tianjin (CN); Mingchuan Han, Tianjin (CN); Jinzhong Yao, Tianjin (CN); Xuesong Xu, Tianjin (CN)

(73) Assignee: NXP USA, Inc., Austin, TX (US)

( * ) Notice: Subject to any disclaimer, the term of this patent is extended or adjusted under 35 U.S.C. 154(b) by 1 day.

(21) Appl. No.: 17/460,379

(22) Filed: Aug. 30, 2021

(65) Prior Publication Data
US 2022/0399257 A1 Dec. 15, 2022

(30) Foreign Application Priority Data
Jun. 11, 2021 (CN) .......................... 202110658220.3

(51) Int. Cl.
| | | |
|---|---|---|
| *H01L 21/56* | (2006.01) | |
| *H01L 23/495* | (2006.01) | |
| *H01L 21/67* | (2006.01) | |
| *H01L 23/31* | (2006.01) | |

(52) U.S. Cl.
CPC ........ *H01L 23/49575* (2013.01); *H01L 21/56* (2013.01); *H01L 21/67144* (2013.01); *H01L 23/31* (2013.01); *H01L 23/49541* (2013.01)

(58) Field of Classification Search
CPC ... H01L 21/56; H01L 21/67144; H01L 23/31; H01L 23/49541; H01L 23/49575
See application file for complete search history.

(56) References Cited

U.S. PATENT DOCUMENTS

| | | | |
|---|---|---|---|
| 5,008,776 A * | 4/1991 | Queyssac .......... | H01L 23/49551 361/728 |
| 7,339,280 B2 * | 3/2008 | Chuang ............... | H01L 23/3107 257/E23.126 |
| 7,727,817 B2 | 6/2010 | Xu et al. | |
| 2001/0023087 A1 * | 9/2001 | Brandl .................. | G01F 1/6845 438/106 |
| 2004/0084758 A1 | 5/2004 | Chuang et al. | |
| 2007/0284715 A1 * | 12/2007 | Li ....................... | H01L 23/3135 257/686 |
| 2019/0067172 A1 * | 2/2019 | Carpenter ........... | H01L 21/4842 |

(Continued)

FOREIGN PATENT DOCUMENTS

| | | |
|---|---|---|
| JP | 60189940 | 9/1985 |
| JP | 61071652 | 4/1986 |

(Continued)

*Primary Examiner* — Hung K Vu

(57) ABSTRACT

An integrated circuit package is formed by positioning an integrated circuit die on a die pad of a leadframe; connecting a bond wire between the die and a bond pad of the leadframe; encapsulating the bond wire, die, and bond pad with an encapsulant material to form a first mold cap of the integrated circuit package; after the encapsulating, bending one or more leads of the leadframe to form one or more bent leads; and encapsulating the first mold cap and a portion of a bend of the one or more bent leads with the encapsulant material to form a second mold cap.

18 Claims, 7 Drawing Sheets

(56) References Cited

U.S. PATENT DOCUMENTS

2019/0348397 A1 11/2019 Wang et al.
2020/0194390 A1* 6/2020 Kim .................... H01L 21/4825

FOREIGN PATENT DOCUMENTS

| JP | 2192758 | | | 7/1990 | | |
|---|---|---|---|---|---|---|
| JP | H0685142 A | * | 9/1992 | ....... H01L 2924/181 |
| JP | 6133449 | | | 5/2017 | | |

* cited by examiner

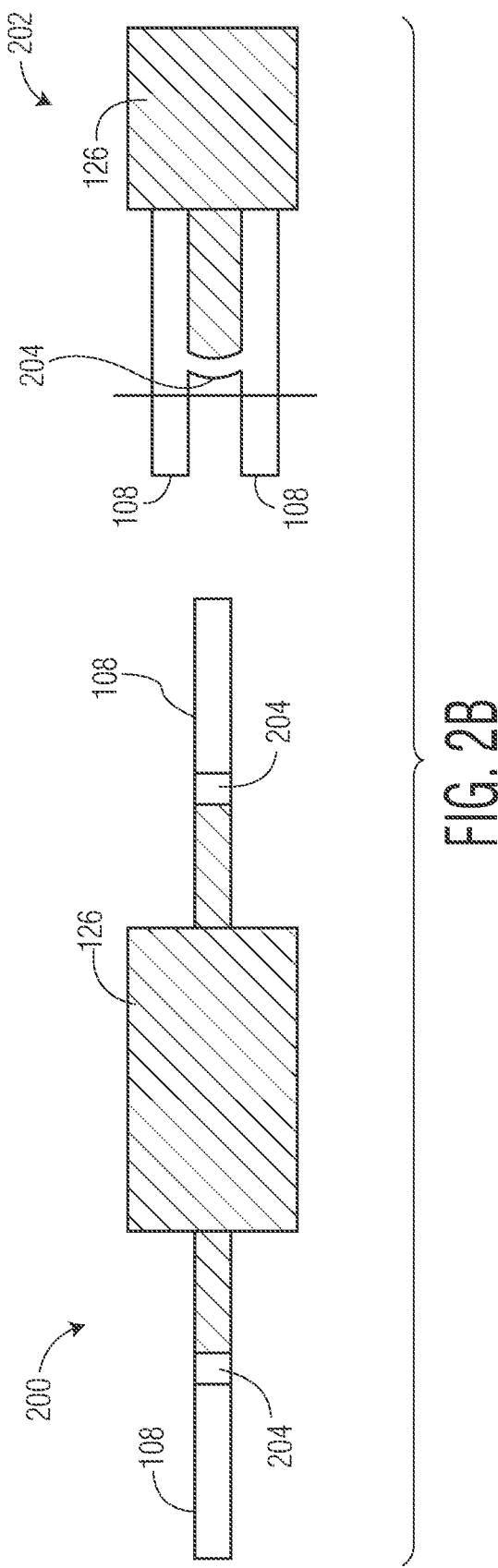

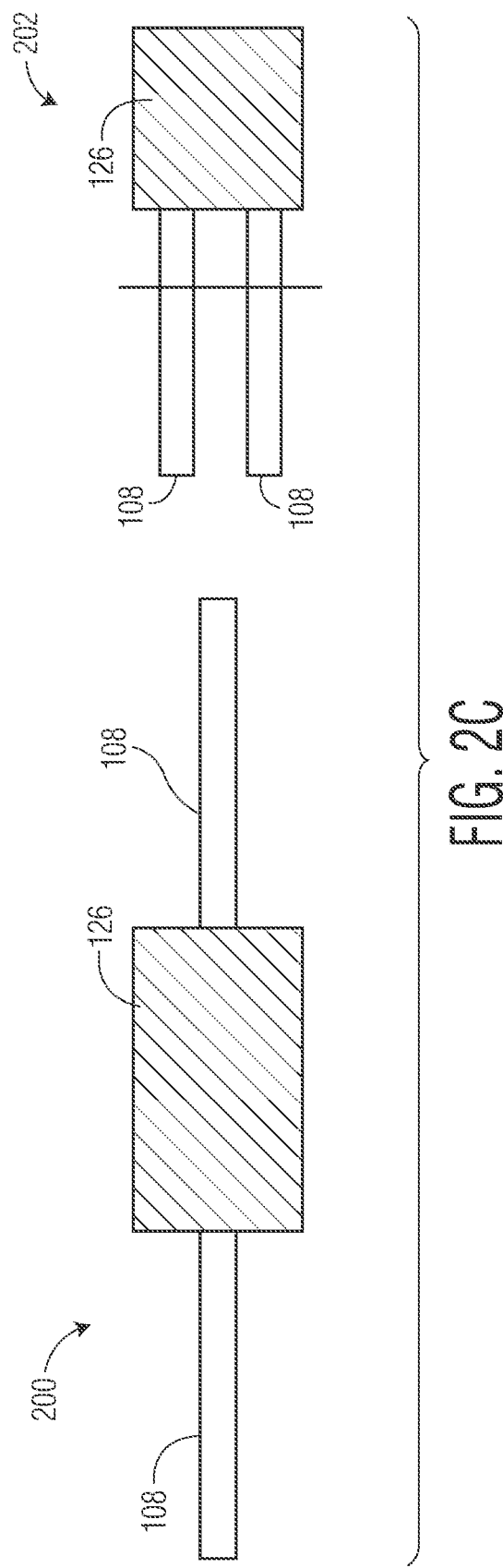

INTEGRATED CIRCUIT PACKAGE AND METHOD TO MANUFACTURE THE INTEGRATED CIRCUIT PACKAGE TO REDUCE BOND WIRE DEFECTS IN THE INTEGRATED CIRCUIT PACKAGE

TECHNICAL FIELD

Embodiments of the subject matter described herein relate generally to an integrated circuit package, including a method to manufacture the integrated circuit package to reduce bond wire defects in the integrated circuit package.

BACKGROUND

An integrated circuit package finds application in a wide variety of electronic components and systems. The integrated circuit package protects an integrated circuit and eases handling of the integrated circuit. The integrated circuit package has a leadframe which includes a die pad, leads, and bond pads for the leads. The integrated circuit, also known as a die, is attached to the die pad of the leadframe and bond wires electrically couple the die to respective bond pads. One or more leads are bent to form one or more bent leads to facilitate formation of gull wing leads or J leads prior to an encapsulation of the die, the bond wire, and the bond pad to form the integrated circuit package.

BRIEF DESCRIPTION OF THE DRAWINGS

A complete understanding of the subject matter may be derived by referring to the detailed description and claims when considered in conjunction with the following figures, wherein like reference numbers refer to similar elements throughout the figures.

FIGS. 2A-2E illustrate a cross sectional view and top view of an example process for forming the integrated circuit package according to an embodiment.

DETAILED DESCRIPTION

Figure 1A:
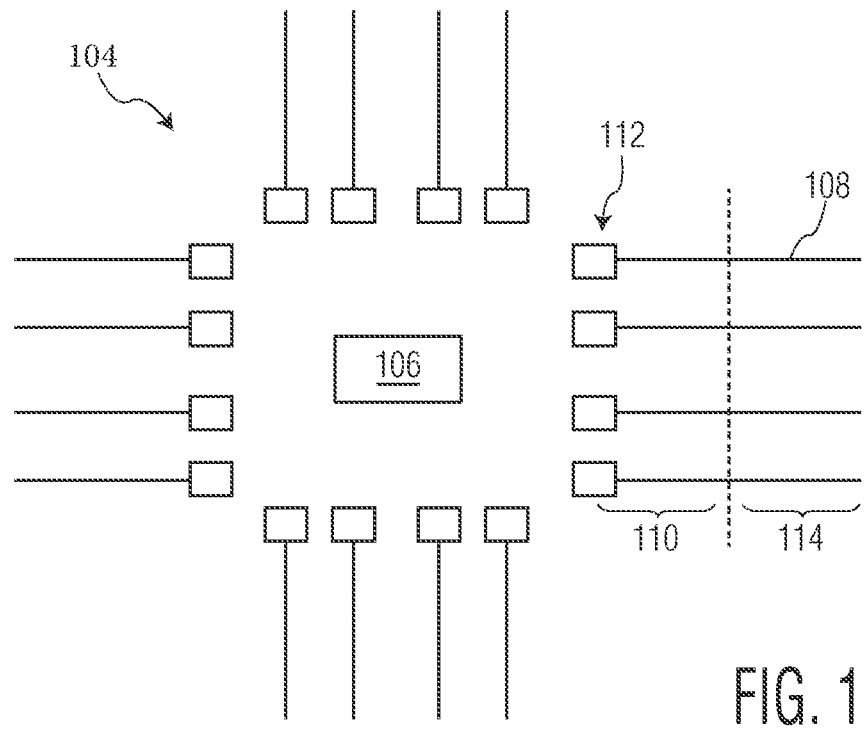
FIGS. 1A-1B show an example top view of a simplified leadframe and cross section view of an example integrated circuit package with the leadframe according to an embodiment.

Leads of a leadframe are each defined by an inner lead closest to a bond pad of the lead and an outer lead. During the bending of a lead of the leads to form a J lead or gull wing lead, the inner lead of the lead typically flexes. The flexing produces a bond wire defect associated with a bond wire connected between a die on the leadframe and the bond pad. The bond wire defect includes one or more of a connection of the bond wire at the bond pad breaking, a connection of the bond wire at the die breaking, or the bond wire itself breaking. To reduce the flexing, a tape is placed over the inner leads of the leads in the leadframe including the lead which is bent. The tape such as a Kapton® tape has a polyimide film and a silicon adhesive which adheres to the inner leads. The tape fixes the inner leads over which the tape is placed to be in a same plane and maintain a same spacing between the inner leads over which the tape is placed when the lead is bent. Ideally, the tape positioned over a large surface area of the inner leads results in less flexing of the inner lead of the lead which is bent. But in some situations, the tape is not able to be positioned over the large surface area of the inner leads due to design of the leadframe resulting in the tape not sticking to the inner leads when the lead is bent, increasing chances of a bond wire defect in the integrated circuit package.

Embodiments disclosed herein are directed to an integrated circuit package and a method to manufacture an integrated circuit package to further reduce bond wire defects during a bending of a lead. The integrated circuit package is formed by a two step molding process. During a first step of the molding process, and after a bond wire is connected between a die on a leadframe and a bond pad of the leadframe, the leadframe is positioned in a mold cavity. In the mold cavity, the die pad, die, bond pad, and bond wire are encapsulated with an encapsulant material to form a first mold cap. The leadframe has dam bars between leads of the lead frame to prevent the encapsulate material from flowing outside of the mold though gaps between the leads during the encapsulation. After the encapsulate material is set, the dam bars and excess encapsulant material are removed by a cutting or punching tool. A lead of the leadframe is then bent to form a bent lead in a second molding process. In a second step of the molding process, the leadframe is positioned in a mold cavity and alternating leads of the leadframe are bent to facilitate the creation of an angled or sloped portion therein so that the portions of the alternating leads which are bent are no longer in the same plane as the other leads which are not bent. Further, in the mold cavity, a second molded cap is formed over the first mold cap and the first mold cap and inner leads are further encapsulated with an encapsulant material to form the second mold cap. Based on the molding processes, the integrated circuit package has the first cap which encapsulates the die, bond pad, and bond wire and the second cap which further encapsulates the first cap and the inner leads. Advantageously, by bending the lead after the encapsulation of the bond wires by the first mold cap, a bond wire defect is reduced. Well known structures and techniques have not been shown in detail in order not to obfuscate the description.

Figure 1B:
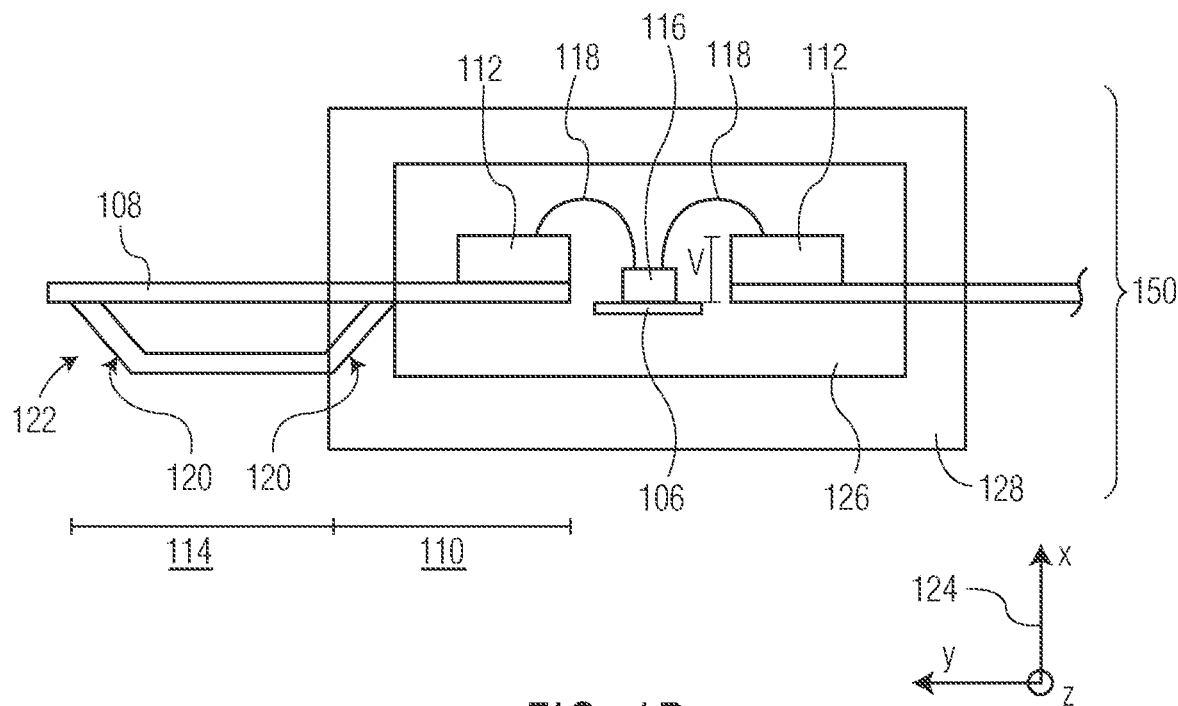

FIGS. 1A-1B show an example top view of a simplified leadframe 104 and cross sectional view of an integrated circuit package 150 with the leadframe 104 according to an embodiment. The integrated circuit package 150 has the leadframe 104 preferably fabricated from a conductive metal material (e.g., copper). The leadframe 104 may includes a die pad 106 and leads 108. In an example, the die pad 106 has four sides and each side thereof has a subset of the plurality of leads 108 extending outwardly or away from the die pad 106. The plurality of leads 108 may be oriented to be in a same plane. The die pad 106 defines opposed, generally planar top and bottom surfaces on which an integrated circuit die 116 may be physically attached such as by an adhesive. The lead 108 may be defined by an inner lead 110 with a bond pad 112 electrically coupled thereto and an outer lead 114. The inner lead 110 may be closest to the die pad 106 and the outer lead 114 may be eventually soldered or otherwise affixed to a printed circuit board (not shown) after the integrated circuit package 150 is formed. Each lead 108 may be associated with and be electrically coupled to a respective bond pad 112. An integrated circuit such as a die 116 may be electrically coupled to the bond pad 112 and lead 108 by a bond wire 118 which forms an electrical connection between the die 116 and the bond pad 112. The configuration of the leadframe 104 may take other forms, in that a number and arrangement of the integrated circuit die, bond pads, leads, and shape may vary as needed to satisfy requirements of a particular application.

Prior to formation of the integrated circuit package 150, the leads 108 of the leadframe 104 may be initially in a same plane (e.g., Y-Z plane) with respect to an x, y, z coordinate system 124 where x and y axis are in a plane of the paper and the z coordinate system is orthogonal to the plane of the paper. Referring to the cross sectional view in more detail, a portion of a lead 108 is bent to form a bent lead 122. The lead 108 is "bent" to form a curve or angle in the lead 108 such that bent lead 122 is still referred to as a lead 108 herein but specifically with a bend. For example, a portion of the lead 108 may be bent to form bent lead 122 so that the portion is no longer in the same plane as the other leads, e.g., bent downwards or upwards from the Y-Z plane. The bent lead 122 is an initial step to forming a J lead or gull wing lead from the bent lead (not shown). The J lead may be a lead 108 with a bend inwards toward a bottom of the die pad 106 while the gull wing lead may be a lead 108 with a bend outwards toward a top of the die pad 106. In some examples, and referring to the cross section 102, alternating leads 108 of the leadframe 104 are bent to form a respective bent lead 122 with a sloped portion 120. Cross section 102 shows the bent lead 122 which has the sloped portion 120 and adjacent lead 108 which has no bend. Further, the bent lead 122 may take other shapes with more or less bends and bends with different angles than as shown.

Embodiments disclosed herein are directed to encapsulating the die 116, die pad 106, bond wire 118, and bond pad 112 by an encapsulant material to form a first mold cap 126 prior to bending the lead 108 to form bent lead 122 to reduce bond wire defects in the integrated circuit package 150. The encapsulation of the die 116, die pad 106, bond pad 112, and bond wire 118 by the first mold cap 126 prior to bending the lead 108 preserves at least a vertical relationship V between the bond pad 112 and die pad 106 when the lead 108 is bent which would otherwise produce a flexing of the inner lead 110 and result in bond wire defects when the lead 108 is bent. The bond wire defect may include one or more of a connection of the bond wire 118 at the bond pad 112 breaking, a connection of the bond wire 118 at the die 116 breaking, or the bond wire 118 itself breaking when the leads 108 are bent. Instead, the bond pad 112 and the die pad 106 remain in a same vertical relationship V during the bending because of the encapsulation. The first mold cap 126 and the inner lead 110 is then encapsulated to form a second mold cap 128. The integrated package with the first mold cap 126 and second mold cap 128 is characteristic of the integrated circuit packaging associated with this process. Advantageously, by bending the leads 108 after forming the first mold cap 126, the bond wire defects are reduced compared to conventionally applying tape to the inner leads of the leads 108 to reduce flexing of the inner lead of the lead that is bent. The tape such as a Kapton® tape has a polyimide film and a silicon adhesive which adheres to the inner leads 110.

FIGS. 2A-2E illustrate an example cross sectional view 200 and top view 202 of an example process for forming the integrated circuit package 150 according to an embodiment. The cross-sectional view 200 shows portions of the integrated circuit package 150 being formed and the top view 202 shows an example two leads of the plurality of leads of the lead frame 104. Each of FIG. 2A-2E illustrate example steps in the example process for forming the integrated circuit package 150. The example process for forming the integrated circuit package 150 is not limited to the illustrated steps. In other examples, the example process may include additional steps, fewer steps, or different steps than what is illustrated.

Figure 2A:
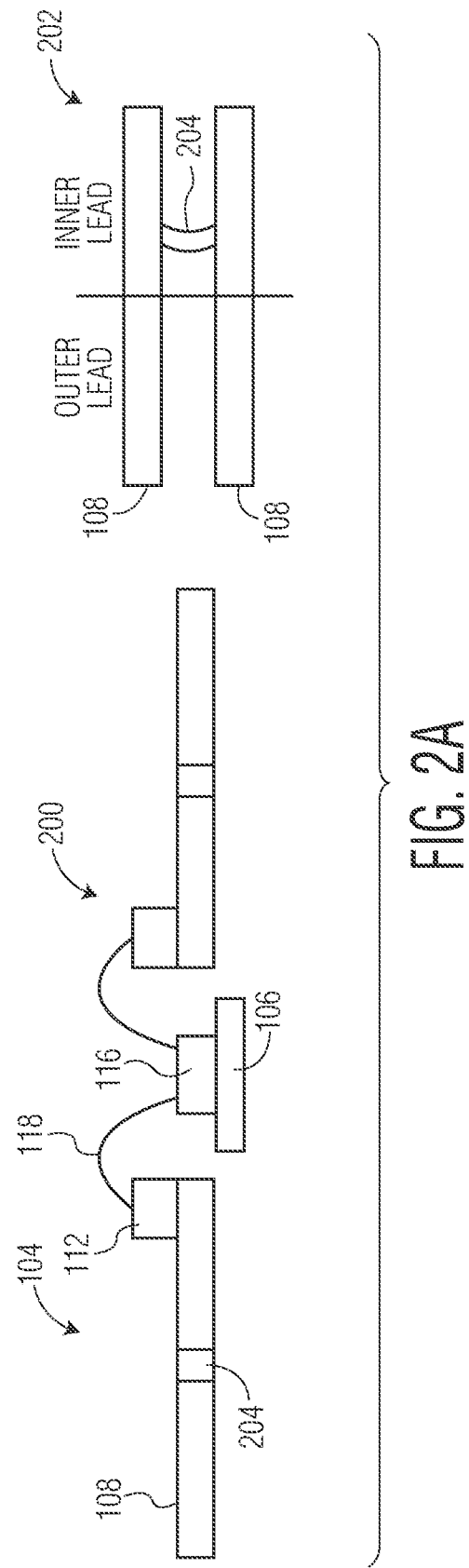

FIG. 2A illustrates an example leadframe 104 prior to an encapsulation process. The leadframe 104 has the die 116 which is attached to the die pad 106 of the leadframe 104. A bond wire 118 electrically couples the die 116 and the lead 108 of the leadframe 104 at the bond pad 112 of the lead 108. The leadframe 104 may be fabricated with a dam bar 204 between adjacent leads 108 of the leadframe 104. The dam bar 204 may be a metal or plastic structure which prevents flow of encapsulant material beyond the dam bar 204 when the die pad 106, the die 116, and the bond wire 118 are encapsulated with an encapsulant material.

FIG. 2B illustrates an example encapsulation of the integrated circuit die 116, die pad 106, bond wire 118, and bond pad 112 with an encapsulant material. In a first step of a molding process, the leadframe 104 is placed in a mold cavity (not shown). The encapsulant material flows in the mold cavity and encapsulates the integrated circuit die 116, die pad 106, bond wire 118, and bond pad 112 on a top, bottom or sides up to the dam bar 204 in the first step of the molding process. The encapsulant material is preferably a plastic (e.g., thermoset, thermoplastic) which, upon hardening, forms a first molded cap 126. At no point before this encapsulation is a lead 108 of the leadframe 104 bent.

FIG. 2C illustrates removal of the dar bar 202 which prevented flow of the encapsulant material beyond the dam bar 202 during the encapsulation process. The removal may be one or more of a trimming or removal of the dam bar 202. Further, any excess encapsulant material between leads up to the dam bar 202 may be removed. A cutting or punching tool may be used to remove the dam bar 204 and the excess encapsulant material.

Figure 2D:
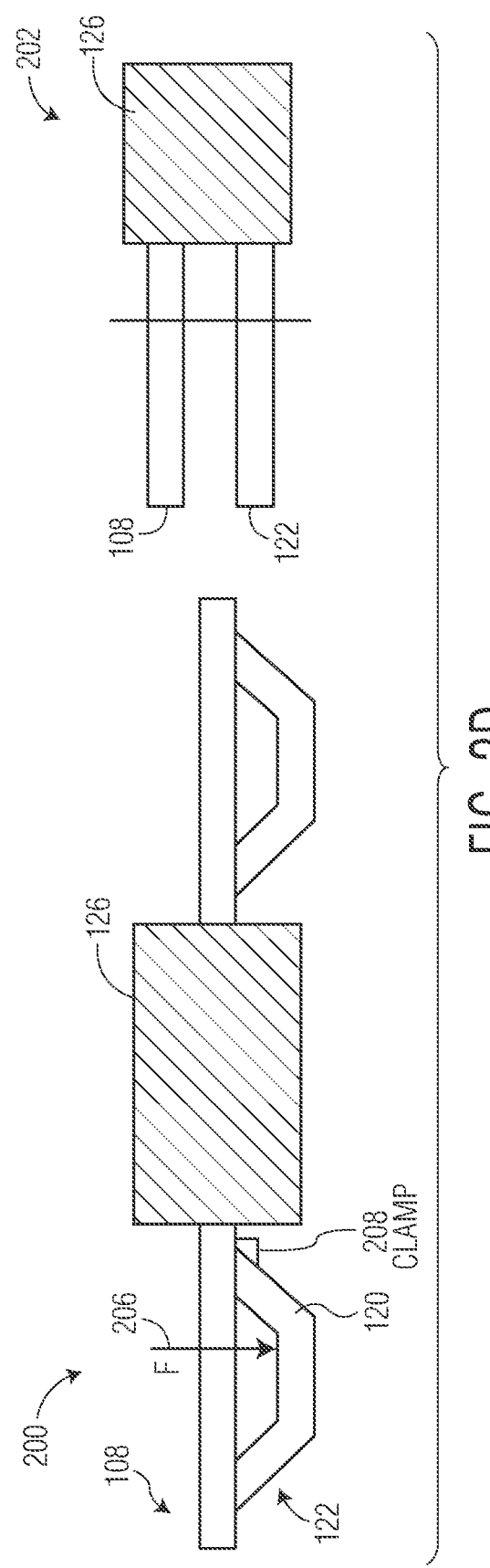

FIG. 2D illustrates an example bending of a lead of the leadframe 104 to form bent lead 122. In a second step of the molding process, the leadframe 104 with the first mold cap 126 is placed in a mold and a force may be applied in a direction shown by arrow 206 at a first position of a lead while placing a clamp 208 at a second position of the lead to form bent lead 122. The mold may be the same mold as used in the first step of the molding process or another mold. The force in some examples may be a vertical force as shown and in examples, the force may form a downset portion 120 of the bent lead 122 which is later bent inward toward a bottom of the die pad 106 to form a J lead. A force may be applied to one or more portions of the bent lead 122 to create one or more bends in the bent lead 122. In examples, alternating leads of the leadframe 104 are bent to facilitate the creation of an angled or sloped portion therein. Further, alternating leads may be bent so that the leadframe 104 has lead 108 which is not bent and bent lead 122. Advantageously, by bending the lead after the encapsulation of the bond wires 118 by the first mold cap 126, bond wire defects is reduced because the first mold cap 126 reduces the flexing of an inner lead of the lead which is bent to form bent lead 122 when the force is applied.

Figure 2E:
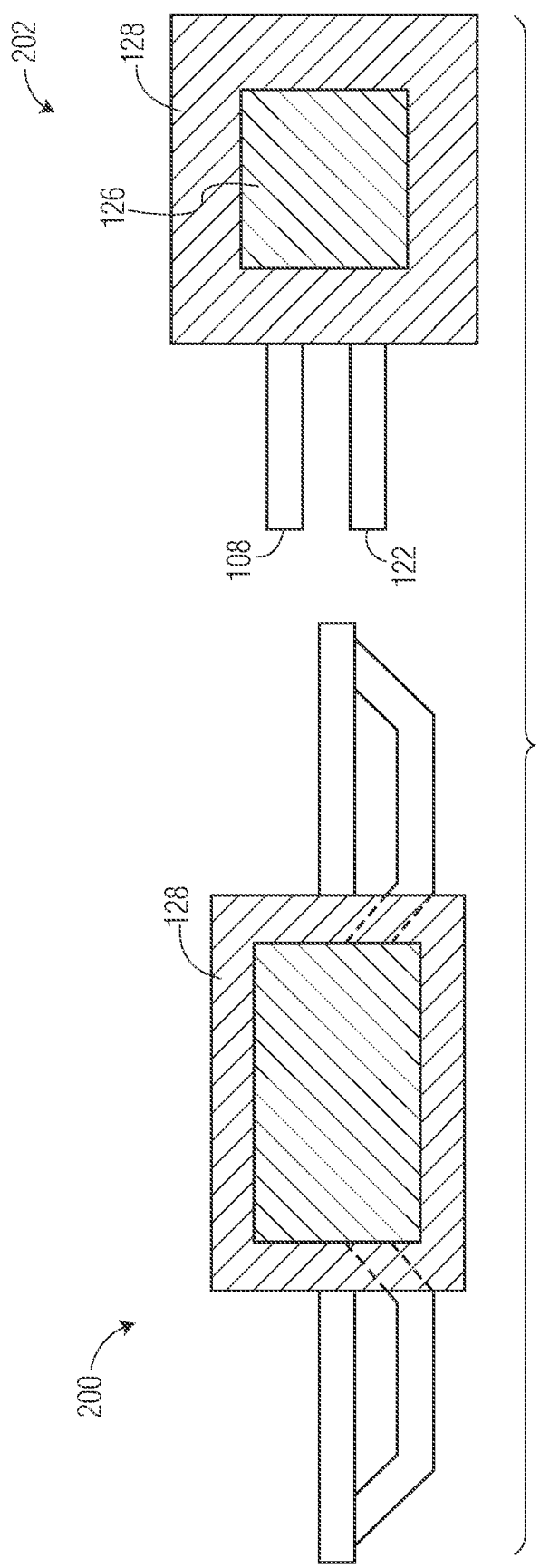

FIG. 2E illustrates an example encapsulation process to form a second mold cap 128 in the second step of the molding process. The leadframe 104 with the first mold cap 126 which is in the mold (not shown) is encapsulated with an encapsulant material to form the second mold cap 128 which encapsulates the first mold cap 126 and at least a portion of the inner lead of the bent lead 122 in the second step of the molding process. The encapsulant material in the second step may be the same or different than the encapsulant material in the first step. The integrated circuit package 150 includes the leadframe 104 encapsulated with the first mold cap 126 and the second mold cap 128 in examples.

Figure 3:
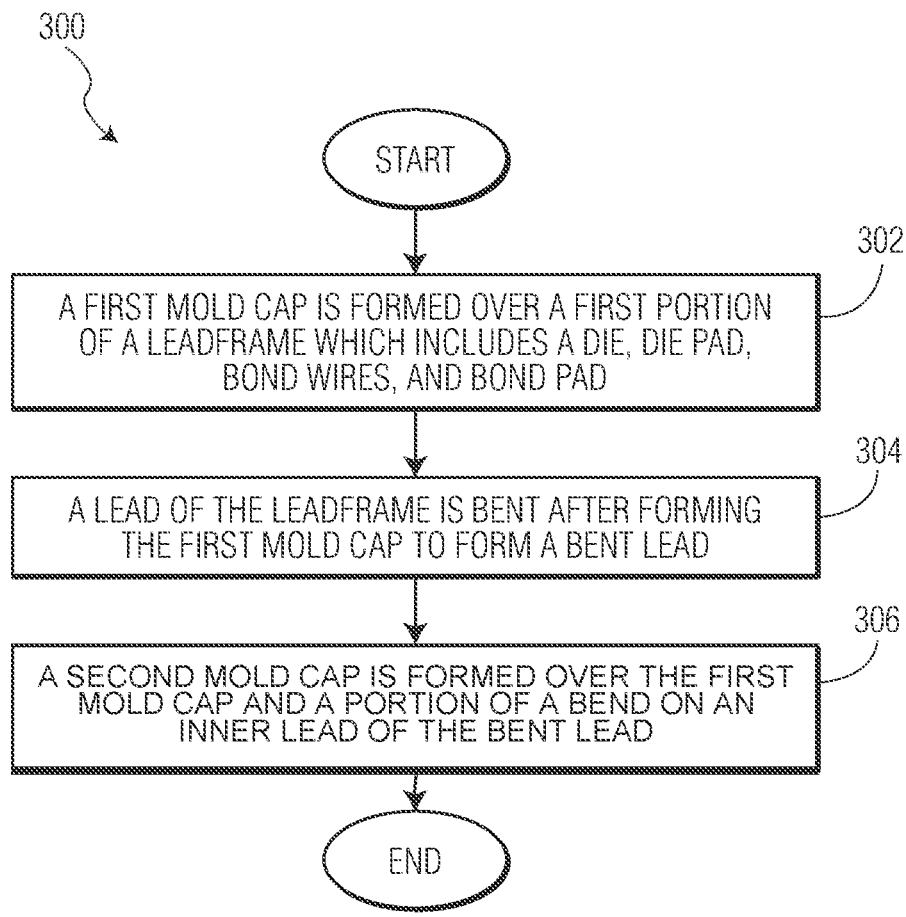
FIG. 3 is an example flow chart of functions associated with manufacturing the integrated circuit package according to an embodiment.

FIG. 3 is an example flow chart 300 of functions associated with manufacture of the integrated circuit package 150 to reduce bond wire defects in the integrated circuit package 150 according to an embodiment. At step 302, a first mold cap is formed over a first portion of a leadframe which includes the die, die pad, bond wires, and bond pad. The first mold cap encapsulates the die, die pad, bond wires, and bond pad within an encapsulant material. At 304, a lead of the leadframe is bent to form a bent lead after the encapsulation to reduce flexing of an inner lead of the lead bent and bond wire defects in the integrated circuit package 150. In examples, the lead may be bent by clamping the lead and applying a force to the lead to bend the lead. At step 306, a second mold cap is formed over the first mold cap and a portion of a bend on an inner lead of the bent lead. In an example, the second mold cap encapsulates the first mold cap and a portion of the bend at the inner lead of the bent lead with an encapsulant material to form the integrated circuit package 150. In some examples, step 304 and step 306 may be performed simultaneously in that the lead is bent and the second mold cap is formed together.

In one embodiment, a method for forming an integrated circuit package is disclosed. The method comprises: positioning an integrated circuit die on a die pad of a leadframe; connecting a bond wire between the die and a bond pad of a lead of the leadframe; encapsulating the bond wire, die, and bond pad with an encapsulant material to form a first mold cap of the integrated circuit package; after the encapsulation to form the first mold cap, bending one or more leads of the leadframe to form one or more bent leads; and encapsulating the first mold cap and a portion of bends of the one or more bent leads with the encapsulant material to form a second mold cap. In an embodiment, the method further comprises trimming or removing a dam bar between the one or more leads after forming the first mold cap. In an embodiment, the bending the one or more leads of the leadframe comprises bending alternating leads by applying a force to a portion of the alternating leads. In an embodiment, the bending the one or more leads of the leadframe comprises bending the one or more leads, wherein the bent leads are not in a same plane as other leads of the leadframe. In an embodiment, the one or more bent leads are associated with J leads of the integrated circuit package. In an embodiment, the first mold cap of the integrated circuit package does not encapsulate any bend of the one or more bent leads of the leadframe. In an embodiment, the bending and encapsulation to form the second mold cap are simultaneous operations. In an embodiment, a vertical distance between the die pad and the bond pad is maintained during the bending. In an embodiment, the one or more leads of the leadframe are in a same plane before being bent. In an embodiment, encapsulating the bond wire, die, and bond pad with the encapsulant material to form the first mold cap of the integrated circuit package comprises stopping a flow of the encapsulant material at a dam bar between the one or more leads. In an embodiment, the first mold cap prevents movement of one or more of the bond wire, the die, the die pad, and the bond pad when the one or more leads are bent.

In another embodiment, an integrated circuit package is disclosed. The integrated circuit package comprises: a leadfame having an integrated circuit die positioned on a die pad of the leadframe and a bond wire connected between the die and a bond pad of a lead of one or more leads of the leadframe; a first mold cap which encapsulates the bond wire, die, and bond pad with an encapsulant material; and a second mold cap which encapsulates the first mold cap and a portion of the one or more leads with the encapsulant material; wherein at least one of the one or more leads have a bend outside of the first mold cap which forms one or more bent leads, a portion of the bend being encapsulated with the second mold cap. In an embodiment, the one or more bent leads are not in a same plane as other leads of the leadframe. In an embodiment, the second mold cap of the integrated circuit package encapsulates the bend of the one or more bent leads. In an embodiment, the one or more bent leads are associated with J leads of the integrated circuit package. In an embodiment, the one or more bent leads are alternating leads of the one or more leads of the lead frame. In an embodiment, the first mold cap of the integrated circuit package does not encapsulates any bend of the one or more bent leads. In an embodiment, the first mold cap prevents movement of one or more of the bond wire, the die, the die pad, and the bond pad when the one or more leads are bent without the second mold cap being part of the integrated circuit package. In an embodiment, a vertical distance between the die pad and the bond pad is maintained when the one or more leads are bent without the second mold cap being part of the integrated circuit package. In an embodiment, the first mold cap encapsulates connections of the bond wire to the bond pad and bond wire to the die.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Although the operations of the method(s) herein are shown and described in a particular order, the order of the operations of each method may be altered so that certain operations may be performed in an inverse order or so that certain operations may be performed, at least in part, concurrently with other operations unless expressly indicated. In another embodiment, instructions or sub-operations of distinct operations may be implemented in an intermittent and/or alternating manner.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for forming an integrated circuit package, the method comprising:
   positioning an integrated circuit die on a die pad of a leadframe;
   connecting a bond wire between the die and a bond pad of a lead of the leadframe;
   encapsulating the bond wire, die, and bond pad with an encapsulant material to form a first mold cap of the integrated circuit package, wherein the first mold cap of the integrated circuit package does not encapsulate any bend of the one or more bent leads of the leadframe;
   after the encapsulation to form the first mold cap, bending one or more leads of the leadframe to form one or more bent leads; and
   encapsulating the first mold cap and a bend of the one or more bent leads outside of the first mold cap with the encapsulant material to form a second mold cap, wherein an end of the lead is not encapsulated with any encapsulant material;
   wherein the one or more bent leads are alternating leads of the one or more leads of the leadframe and leads in between the alternating bent leads are not bent.

2. The method of claim 1, further comprising trimming or removing a dam bar between the one or more leads after forming the first mold cap.

3. The method of claim 1, wherein bending the one or more leads of the leadframe comprises bending alternating leads by applying a force to a portion of the alternating leads.

4. The method of claim 1, wherein the one or more bent leads are associated with J leads of the integrated circuit package.

5. The method of claim 1, wherein a vertical distance between the die pad and the bond pad is maintained during the bending.

6. The method of claim 1, wherein the one or more leads of the leadframe are in a same plane before being bent.

7. The method of claim 1, wherein encapsulating the bond wire, die, and bond pad with the encapsulant material to form the first mold cap of the integrated circuit package comprises stopping a flow of the encapsulant material at a dam bar between the one or more leads.

8. The method of claim 1, wherein the first mold cap prevents movement of one or more of the bond wire, the die, the die pad, and the bond pad when the one or more leads are bent.

9. The method of claim 1, further comprising affixing a respective portion of the bent leads and the leads in between the alternating bent leads outside a periphery of the second mold cap to a printed circuit board.

10. A method for forming an integrated circuit package, the method comprising:
    positioning an integrated circuit die on a die pad of a leadframe;
    connecting a bond wire between the die and a bond pad of a lead of the leadframe;
    encapsulating the bond wire, die, and bond pad with an encapsulant material to form a first mold cap of the integrated circuit package;
    after the encapsulation to form the first mold cap, bending one or more leads of the leadframe to form one or more bent leads; and
    encapsulating the first mold cap and a portion of a bend of the one or more bent leads with the encapsulant material to form a second mold cap, wherein bending the one or more leads of the leadframe comprises bending the one or more leads, wherein the bent leads are not in a same plane as other leads of the leadframe.

11. A method for forming an integrated circuit package, the method comprising:
    positioning an integrated circuit die on a die pad of a leadframe;
    connecting a bond wire between the die and a bond pad of a lead of the leadframe;
    encapsulating the bond wire, die, and bond pad with an encapsulant material to form a first mold cap of the integrated circuit package;
    after the encapsulation to form the first mold cap, bending one or more leads of the leadframe to form one or more bent leads; and
    encapsulating the first mold cap and a portion of a bend of the one or more bent leads with the encapsulant material to form a second mold cap; wherein the first mold cap of the integrated circuit package does not encapsulate any bend of the one or more bent leads of the leadframe; and wherein the bending and encapsulation to form the second mold cap are simultaneous operations.

12. An integrated circuit package comprising:
    a leadframe having an integrated circuit die positioned on a die pad of the leadframe and a bond wire connected between the die and a bond pad of a lead of one or more leads of the leadframe;
    a first mold cap which encapsulates the bond wire, die, and bond pad with an encapsulant material; and
    a second mold cap which encapsulates the first mold cap and a portion of the one or more leads with the encapsulant material;
    wherein at least one of the one or more leads have a bend outside of the first mold cap which forms one or more bent leads, the bend being encapsulated with the second mold cap, wherein an end of the lead is not encapsulated with any encapsulant material; wherein the first mold cap of the integrated circuit package does not encapsulate any bend of the one or more bent leads; and
    wherein the one or more bent leads are alternating leads of the one or more leads of the leadframe and leads in between the alternating bent leads are not bent.

13. The integrated circuit package of claim 12, wherein the one or more bent leads are not in a same plane as other leads of the leadframe.

14. The integrated circuit package of claim 12, wherein the one or more bent leads are associated with J leads of the integrated circuit package.

15. The integrated circuit package of claim 12, wherein the first mold cap prevents movement of one or more of the bond wire, the die, the die pad, and the bond pad when the one or more leads are bent without the second mold cap being part of the integrated circuit package.

16. The integrated circuit package of claim 12, wherein a vertical distance between the die pad and the bond pad is maintained when the one or more leads are bent without the second mold cap being part of the integrated circuit package.

17. The integrated circuit package of claim 12, wherein the first mold cap encapsulates connections of the bond wire to the bond pad and bond wire to the die.

18. The integrated circuit package of claim 12, wherein a respective portion of the bent leads and the leads in between the alternating bent leads outside a periphery of the second mold cap are affixed to a printed circuit board.

* * * * *